United States Patent
Campagna

(10) Patent No.: US 7,141,976 B2
(45) Date of Patent: Nov. 28, 2006

(54) METHOD AND CONTROL DEVICE FOR DETERMINING THE POSITION OF A LOCAL COIL ON A PATIENT TABLE OF A MAGNETIC RESONANCE SCANNER

(75) Inventor: Swen Campagna, Engelthal (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/123,670

(22) Filed: May 6, 2005

(65) Prior Publication Data

US 2005/0253584 A1   Nov. 17, 2005

(30) Foreign Application Priority Data

May 7, 2004   (DE)   ............ 10 2004 022 559

(51) Int. Cl.
*G01V 3/00*   (2006.01)
(52) U.S. Cl. .............. 324/318; 324/322; 600/424
(58) Field of Classification Search ........... 324/318, 324/322; 600/424
See application file for complete search history.

(56) References Cited

U.S. PATENT DOCUMENTS

| | | | | |
|---|---|---|---|---|
| 5,066,915 A | * | 11/1991 | Omori et al. | ............... 324/318 |
| 5,490,508 A | * | 2/1996 | Kato | ........................... 600/422 |
| 5,722,410 A | * | 3/1998 | NessAiver | ................... 600/422 |
| 5,936,406 A | | 8/1999 | Potthast | |
| 6,317,619 B1 | * | 11/2001 | Boernert et al. | ............ 600/410 |
| 6,687,530 B1 | * | 2/2004 | Dumoulin | .................... 600/423 |
| 6,794,872 B1 | | 9/2004 | Meyer et al. | |
| 6,879,160 B1 | * | 4/2005 | Jakab | ......................... 324/318 |

\* cited by examiner

*Primary Examiner*—Louis M. Arana
(74) *Attorney, Agent, or Firm*—Schiff Hardin LLP

(57) ABSTRACT

In a method and control device for determining the position in at least one spatial direction of a local coil on a patient table in a scanner of a magnetic resonance tomography apparatus, a radio-frequency signal is emitted in the presence of a magnetic field gradient applied in the appertaining spatial direction and a signal profile is measured by the local coil along the magnetic field gradient. The signal profile is acquired for each of a number of positions of the patient table relative to the scanner along the magnetic field gradient. Based on the measured signal profile the position of the local coil is determined.

9 Claims, 6 Drawing Sheets

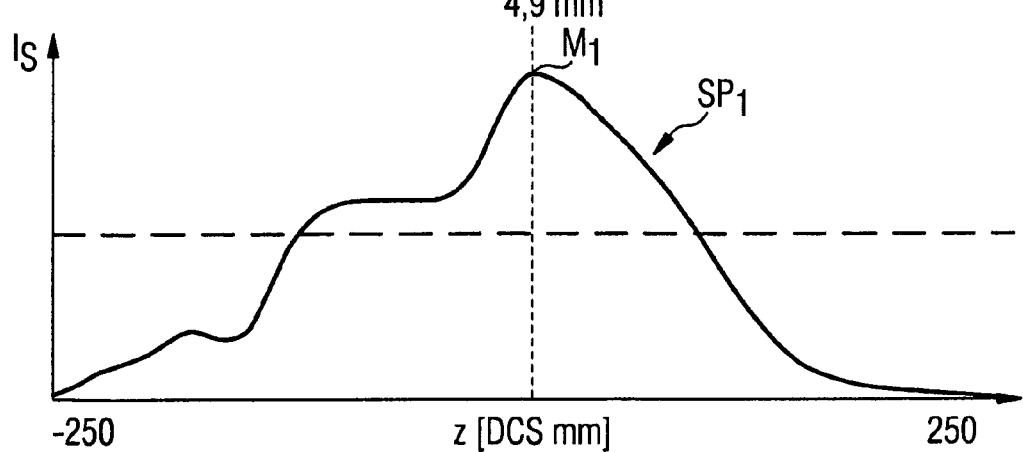
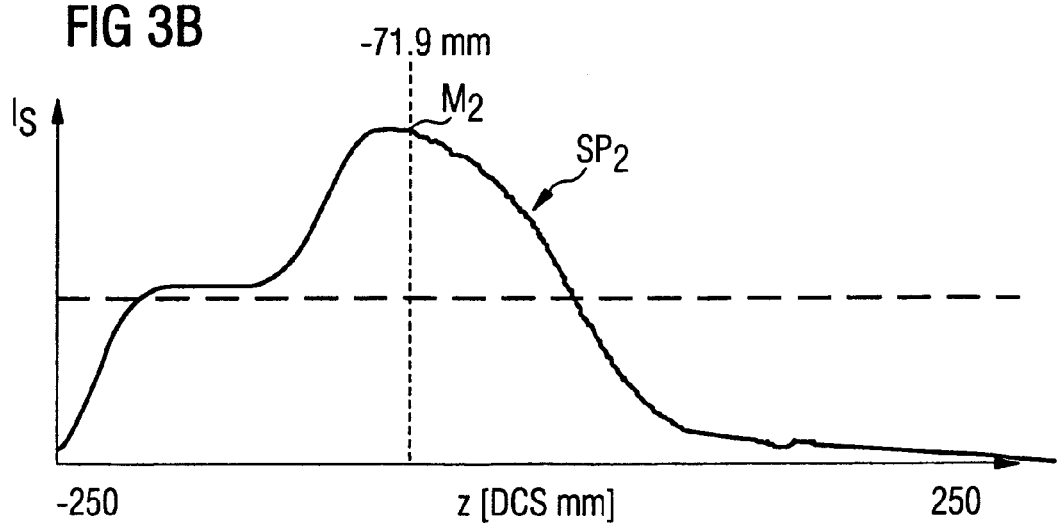

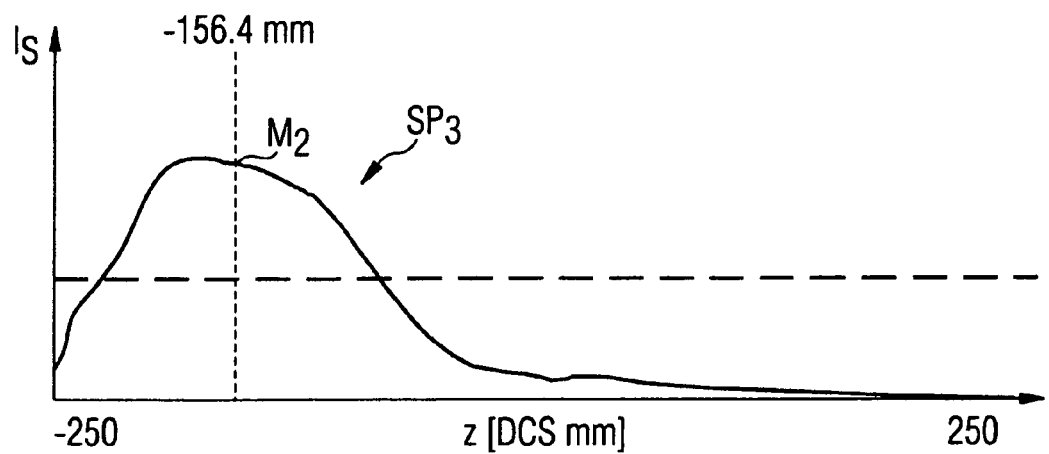
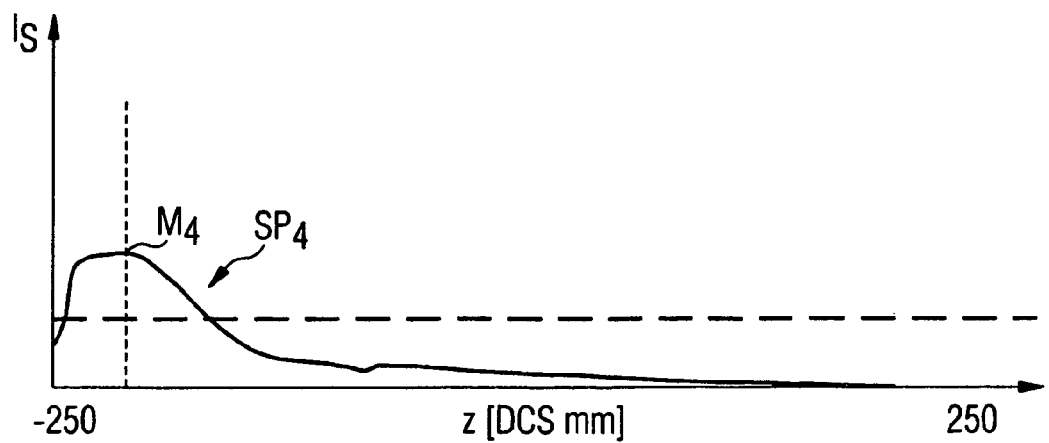

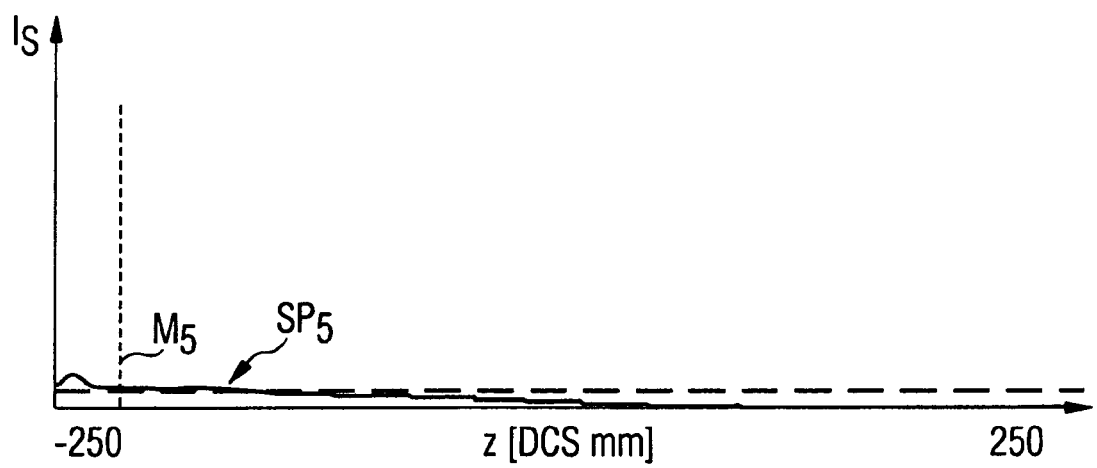
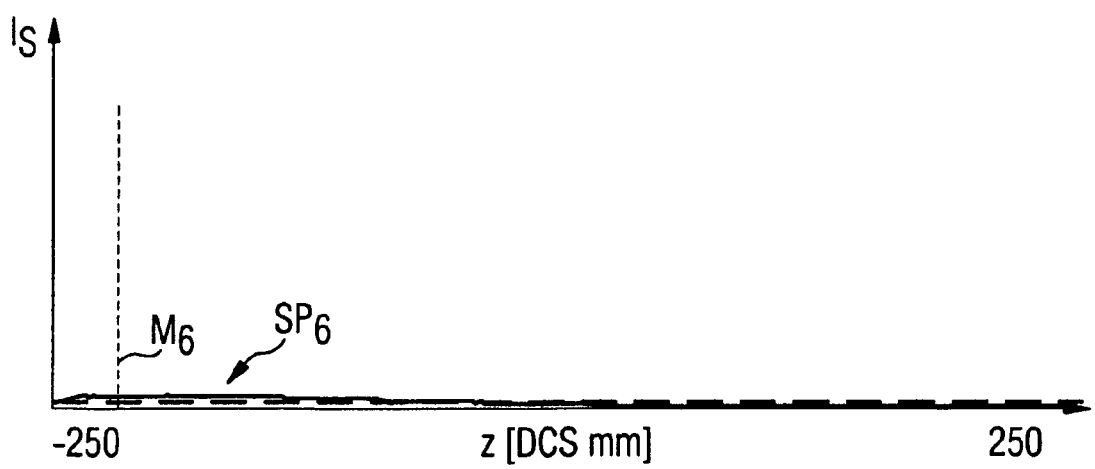

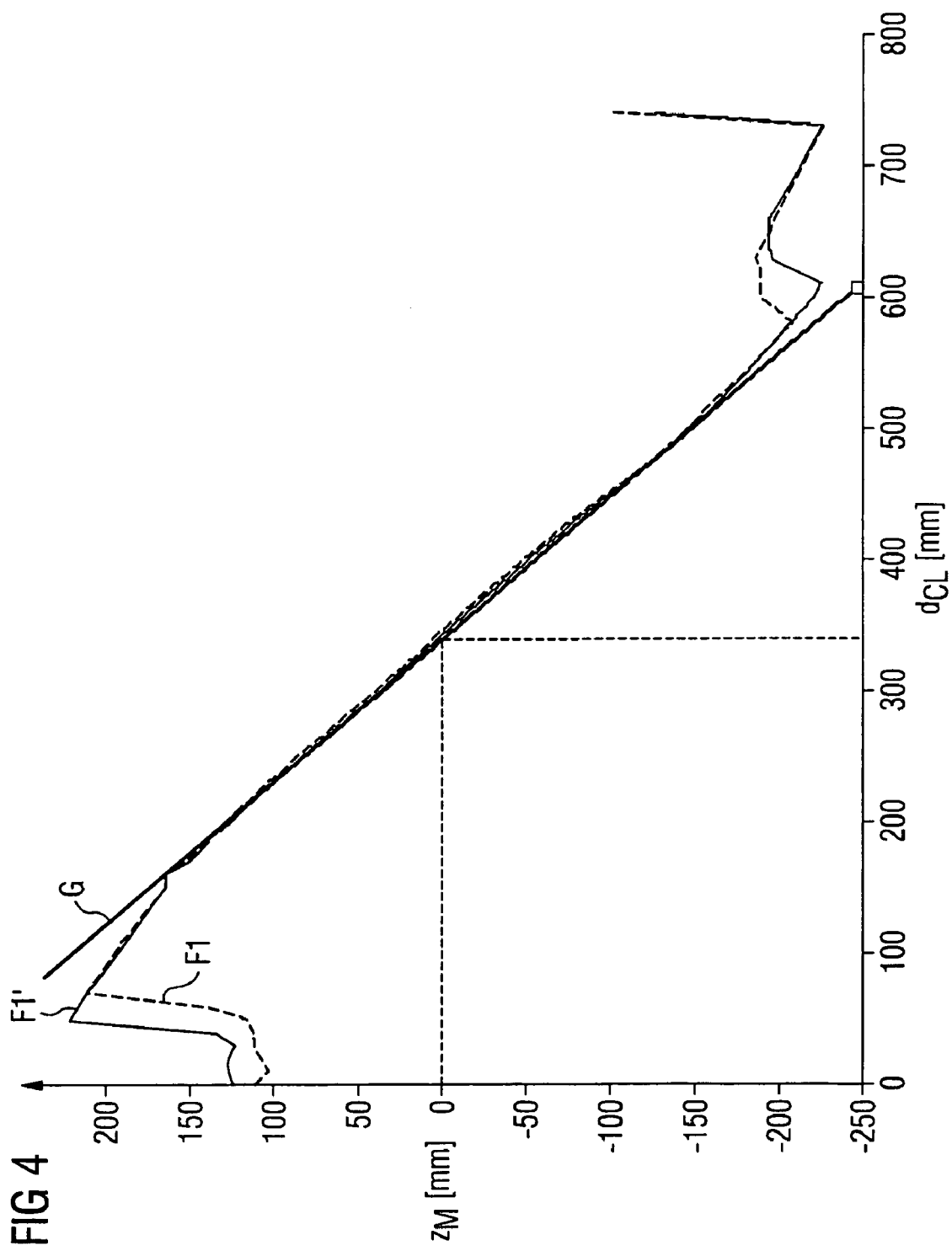

METHOD AND CONTROL DEVICE FOR DETERMINING THE POSITION OF A LOCAL COIL ON A PATIENT TABLE OF A MAGNETIC RESONANCE SCANNER

BACKGROUND OF THE INVENTION

1. Field of the Invention

The present invention concerns a method for determining the position in at least one spatial direction of a local coil on a patient positioning table or board within a magnetic resonance tomography scanner, in which a radio-frequency signal is emitted in volume in which a magnetic field gradient is applied in the appertaining spatial direction and a signal profile is measured along the magnetic field gradient by means of the appertaining local coil. The invention also concerns a corresponding control device for a magnetic resonance tomography apparatus for determining the position of a local coil according to such a method as well as a magnetic resonance tomography apparatus with such a control device.

2. Description of the Prior Art

Modern magnetic resonance examination systems normally operate with a number of various antennas (called coils in the following) to emit radio-frequency pulses for nuclear magnetic resonance excitation and/or to receive the induced magnetic resonance signals. A magnetic resonance system normally have a larger whole-body coil installed in a fixed manner in the apparatus. The whole-body coil is typically cylindrically arranged around the patient acquisition space (for example with what is known as a birdcage structure) in which the patient is situated on the patient positioning table during the measurement. Furthermore, one or more small local coils or surface coils are frequently used in a scanner. The local coils serve to acquire detailed images of body parts that are located relatively close to the body surface. For this purpose, the local coils are applied directly on the point of the patient at which the region to be examined is located. Given a use of such a local coil, in many cases transmission is made with the whole-body coil (as a transmission coil) and the induced magnetic resonance signals are received with the local coil (as a reception coil).

For the magnetic resonance examination, it is important to know the exact position of the local coils that are employed relative to the patient table, and therewith relative to the patient. In principle, with the patient table moved out of the imaging volume, it is possible to measure the position of the coils manually using rulers, measuring sticks, markings on the patient table etc. Such a measurement is notably complicated and additionally entails the danger that the measured positions are associated with the wrong coils, in particular given a use of a number of coils or given the use of coil arrays formed of a number of coils. In principle, it is therefore simpler and safer to automatically determine the position of the local coils in the framework of a magnetic resonance measurement Such an automatic determination of the position of a local coil on a patient table in a specific spatial direction can ensue according to the initially-described method, by applying a magnetic field gradient in the appertaining spatial direction in which the position should be determined. A radio-frequency signal is then emitted by the whole-body coil or with a local coil, and a reception signal profile is measured along the magnetic field gradient by means of the appertaining local coil whose position should be established. The position of the local coil in the appertaining spatial direction is finally determined with the aid of this signal profile.

Such a method is specified in German PS 196 53 535. The reception signals are received by, apart from the local coil to be localized, an antenna with a homogenous sensitivity over the entire measurement space, for example by the whole-body coil. The intensity values received by the local coil are normalized with the intensity values received by the antenna with homogenous sensitivity. A maximum point obtained from the spatial curve of these normalized intensity values is then acquired as a position value for the local coil. Since, due to the noise portions in the measurement signals, this spatial determination can be relatively error-prone, in German OS 102 07 736 it is proposed to adapt a function (that is approximated to the form of the sensitivity profile of the local coil) to the spatial curve of the intensity values, and to use on the maximum point of this function as the position of the local coil.

A problem in the determination of the coil position according to one of these known methods occurs in the particularly significant determination of the position of the coil in the longitudinal direction of the patient table—typically designated as the z-direction. The possibility exists that the coil is located all the way at the edge of or outside of the scanner, and therewith outside of the magnetic field, since the patient table can be adjusted in the z-direction and is normally only partially located within the scanner. However, if a local coil is located directly on the edge of the magnetic resonance scanner, the coil profile varies (for example) unpredictably and chaotically. If the local coil is located outside of the scanner, a relevant coil profile can no longer be measured at all. This leads to a completely wrong position being determined for such local coils with the typical position determination methods.

SUMMARY OF THE INVENTION

It is an object of the present invention to improve a method of the initially cited type for automatic detection of the position of a local coil, so that the local coil can be relatively safely and precisely localized independent of its position on the patient table, and in particular so that the aforementioned problems are prevented. Moreover, it is an object of the invention to provide a corresponding control device and a magnetic resonance tomograph apparatus with which such a measurement can be implemented.

This object is achieved in accordance with the present invention by a method and a control device for determining the position in at least one spatial direction of a local coil on a patient table in a scanner of a magnetic resonance tomography apparatus, wherein a radio-frequency signal is emitted in the presence of a magnetic field gradient applied in the appertaining spatial direction, and wherein a signal profile is measured by the local coil along the magnetic field gradient at each of a number of positions of the patient table relative to the scanner along the magnetic field gradient. Based on the measured signal profile, the position of the local coil is determined.

In contrast to the known method in which the coil position detection ensues exclusively in the framework of a single magnetic resonance measurement in which the patient table is in a fixed position, a signal profile is measured in accordance with the invention along the magnetic field gradient at a number of positions of the patient table relative to the scanner, i.e. relative to a fixed point within the scanner, and the position of the local coil is determined on the basis of a number of such signal profiles. For this purpose, the patient table can be continuously moved through the scanner during a coil position detection measurement, allowing continuous signal profiles or quasi-continuous signal profiles to be mapped at a large number of points. In principle, however, it is also sufficient—for example with systems that, dependent on hardware, are not able to move the patient table continuously through the scanner—to move the patient table to a number of discrete positions within the scanner and there to implement individual measurements of the signal profiles, which are then evaluated further.

By the shifting of the patient table in or between the measurements, the measurable signal profile is virtually [sic] moved through the magnetic resonance system. If the local coil is located within the scanner, the signal profile shifts approximately with the movement of the patient table. The signal profile varies in an unpredictable manner at the edge of the scanner and a relevant signal profile is no longer measured outside of the scanner. Only the change or shift of the signal profile then has to be protocolled and compared with the shift of the position of the patient table relative to the scanner. The region in which a reliable signal profile is registered then can be very simply identified from these data. These are precisely the regions in which the shift of the signal profile corresponds to the shift of the patient table relative to the scanner. In this manner, it can be easily identified when a local coil is located within the scanner. The position of the local coil relative to the patient table can then be positively determined.

Further advantages of the inventive method are that, by the consideration of a number of signal profiles for an individual position determination—which is different than the use of only one stationary exposure of a coil profile—the noise of individual measurements and the distortion can be excluded by averaging over the various measurements or by symmetry considerations, and thus the position determination is possible with far higher precision than with conventional techniques.

An inventive control device for a magnetic resonance tomography apparatus for—preferably completely automatic—determining the position of a local coil on a patient table within the magnetic resonance tomography apparatus has a control unit that moves the patient table relative to the scanner along a magnetic field gradient. Furthermore, the control device has a measurement device to measure, by means of the appertaining local coil, a signal profile of an emitted radio-frequency signal at various positions of the recumbent board relative to the scanner along the magnetic field gradient. An evaluation device is required which then determines the position of the local coil based on the measured signal profile.

Preferably, only a characteristic position value representing the appertaining signal profile is determined from the measured signal profiles, for example a maximum or a primary focus of the signal profile. For this, the evaluation device preferably has a suitable profile analysis unit. The position of the local coil is then determined based on these scalar position values and not by the use of the complete signal profiles. This significantly accelerates and simplifies the calculation of the position.

In a preferred embodiment of the inventive method, a straight line with a predetermined slope is adapted to the determined characteristic position values as a function of the respective position of the patient table (relative to the scanner) acquired in the measurement of the associated signal profile.

Graphically, this can be visualized by plotting the determined characteristic position values of the various signal profiles (which essentially represent the positions of the coil relative to the scanner in the individual measurements) as function values dependent on the respective positions of the patient table relative to the scanner. The graph thereby created would have to form a straight line with a predetermined slope, at least in the region in which the data are reliable, since within this region the signal profile shifts approximately with the movement of the recumbent board. The slope thereby depends on the scale on which the characteristic position values of the signal profiles (i.e. the position of the coil relative to the tomograph), and the position of the patient table relative to the scanner, are plotted.

If scales with the same units are used, the slope would have to be equal to 1 or −1 in this range.

A straight line with the corresponding slope can then be adapted to these graphs with the aid of typical mathematical fit methods, for example such that the deviations of the function values from a straight line are minimal. The position of the sought local coil relative to the patient table can then be particularly precisely determined by a simple recalculation of the coordinates of an arbitrary point on the straight line. Measurement errors that are dependent on noise and distortions are automatically eliminated by a fit of the straight line to the measured curve.

As soon as the position of the local coil on the patient table (i.e. in the shift direction of the patient table) has been unambiguously determined in the inventive manner, the patient table can be moved into an optimal position of the coil within the scanner at which a signal profile can be measured particularly well. By application of x- and y-magnetic field gradients in the directions transverse to the shift direction of the patient table, new signal profiles can be acquired and the positions can also be determined in these directions. Since it is ensured that the position of the local coil within the scanner has been selected accurately, the position measurement in the x- and y-directions is correspondingly exact.

If multiple local coils are used, the measurements of the signal profiles for the various coils preferably is implemented simultaneously. This means that it is sufficient to move the patient table once through the scanner and thereby to implement all signal profile measurements of the various local coils.

Further system parameters can be determined during the signal profile measurement at the various positions of the patient table and/or between the signal profile measurements in the movement of the patient table. Thus, for example, fast localizer scans can be generated in the movement of the recumbent board. The time of the patient table movement can be used multiple times to determine other system parameters by the combination of the coil position detection measurement with further measurements.

DESCRIPTION OF THE DRAWINGS

FIGS. 3A though 3F show the signal profiles, determined in an inventive coil localization measurement, of a local coil located at a specific position on the patient table for different positions of the patient table in the scanner.

FIG. 4 shows measurement curves for two local coils located next to one another at the same z-position as well as a straight line adapted to these measurement curves.

DESCRIPTION OF THE PREFERRED EMBODIMENTS

Figure 1:
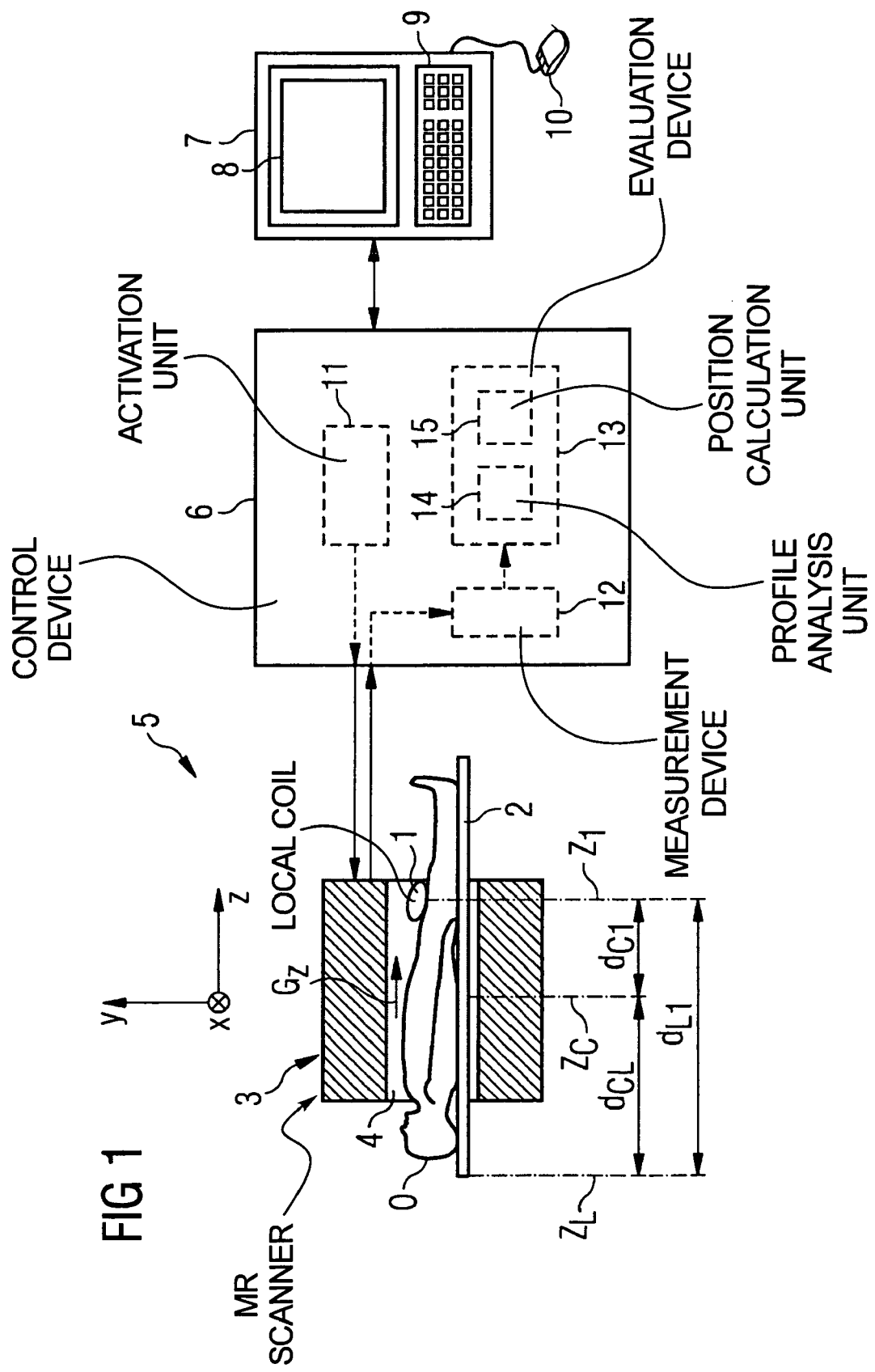
FIG. 1 schematically illustrates an inventive magnetic resonance system.

FIG. 1 shows an exemplary embodiment for a magnetic resonance system 5 in which an automatic determination of the position of a local coil 1 is possible according to the inventive method. The core of this magnetic resonance system 5 is a scanner 3 itself, in which a patient O is positioned on the patient table 2 in an annular basic field magnet (not shown in detail) that surrounds the measurement space 4.

The patient table 2 can be shifted in the longitudinal direction, i.e. along the longitudinal axis of the scanner 3. This direction is designated as the z-direction in the spatial coordinate system (likewise shown). A whole-body coil with which radio-frequency pulses can be emitted and received is located within the basic field magnet in the scanner 3. Moreover, in a typical manner the scanner 3 has gradient coils in order to be able to apply a magnetic field gradient in each of the spatial directions x, y, z.

The scanner 3 is operated by a control device 6 that is shown separately here. A terminal (console) 7 is connected to the control device 6. This terminal 7 has a display screen 8, a keyboard 9 and a pointing device for a graphical user interface, for example a mouse 10 or the like. Among other things, the terminal 7 serves as a user interface via which an operator operates the control device 6 and therewith the scanner 3. Both the control device 6 and the terminal 7 can be integral components of the scanner 3.

Moreover, the magnetic resonance system 5 can also have all further typical components or features such as, for example, interfaces for connection of a communication network, for example of an image information system or similar. However, all of these components are not shown in FIG. 1 for better clarity.

An operator can communicate with the control device 6 via the terminal 7 and thus provide for the implementation of the desired measurements, so that, for example, the scanner 3 is operated by the control device 6 such that the necessary radio-frequency pulse sequences are emitted by the antenna and the gradient coils are switched in a suitable manner. The raw image data arriving from the scanner are also acquired via the control device 6 and the images are reconstructed in a signal evaluation unit (not shown in detail) which, for example, can be a module of the control device 6. These images are then, for example, shown on the screen of the terminal 7 and/or stored in a memory or sent over a network.

In the shown exemplary embodiment, the control device 6 is designed such that it is able to fully automatically determine the position $z_1$ of a local coil 1 (which is located on the patient O) relative to the patient table 2. The position $z_1$ is thereby determined in the z-direction with the inventive method. The determined position specification can refer to the position $z_L$ of a fixed point on the patient table 2, for example to the head-side end ("head") of the patient table 2. This fixed point thus can form an origin for a patient table coordinate system which moves with the patient table 2. The position $z_1$ of the coil 1 then can be determined as a distance $d_{L1}$ relative to this fixed point in this patient table coordinate system.

As mentioned above, the patient table 2 can be moved in a motorized manner in the z-direction within the scanner 3. The control device 6 has an activation unit 11 that automatically drives the patient table 2 through the scanner 3 or moves toward various positions within the scanner 3. Moreover, by means of the activation unit 11 a defined magnetic field gradient $G_z$ is switched in the z-direction and, simultaneously, a radio-frequency signal, which essentially corresponds to the magnetic resonance frequency, is, emitted by the whole-body coil.

A reception signal profile is then recorded in the z-direction (.e. in the direction of the magnetic field gradient $G_z$) with the local coil 1 whose position $z_1$ is to be determined. The control device 6 has a measurement device 12 for this purpose.

Such a signal profile is recorded (acquired) at a number of positions of the patient table 2 within the scanner 3. The patient table 2 can also be moved continuously or quasi-continuously, with a signal profile being acquired constantly or at a number of points in close succession.

Figure 2:
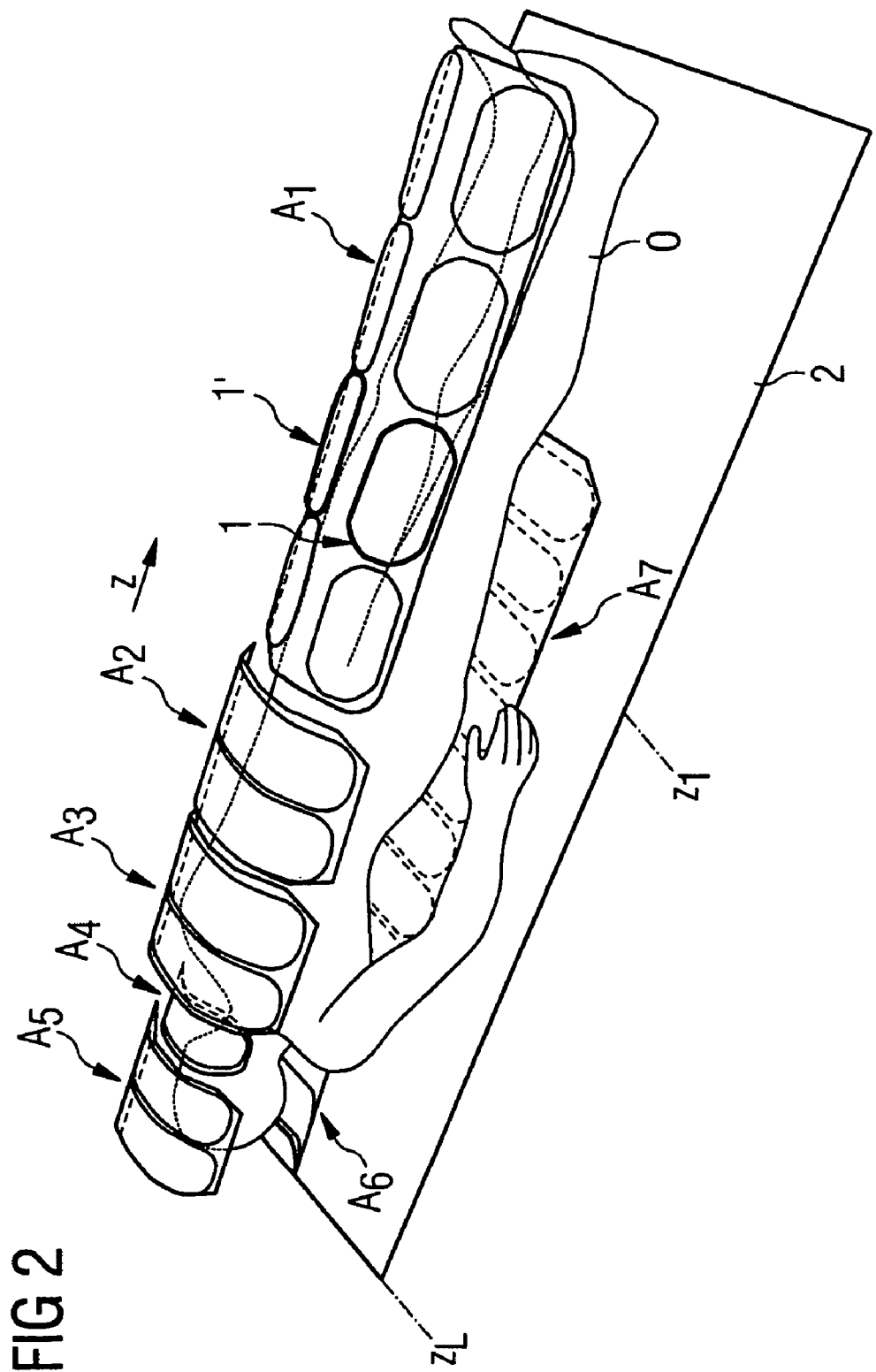
FIG. 2 is a schematic perspective view of a patient on a patient table with a number of local coil arrays.

The procedure is explained in detail using an actual measurement, with reference to FIGS. 2 through 4.

A single local coil 1 is only roughly schematically shown in FIG. 1. In contrast to this, FIG. 2 shows an actual case in an implemented experiment in which a patient O lies on a patient table 2 and a number of local coil arrays $A_1, A_2, A_3, A_4, A_5, A_6, A_7$ are positioned both under the patient and on the patient. Each local coil array $A_1, A_2, A_3, A_4, A_5, A_6, A_7$ is normally formed of a number of individual local coils. In the illustrated case, a large array $A_7$ with eight individual coils lies below the patient O in the spinal column region up to the knee region. Two arrays $A_5, A_6$ with two coils respectively lie under the head and on the face of the patient O, with which images can be acquired from the head of the patient. A further array $A_4$ (here formed of only one coil) is placed on the throat of the patient O. Furthermore, two arrays $A_2, A_3$ each with two larger local coils are located on the chest space and abdomen space of the patient O. A local coil array $A_1$ with a total of eight local coils is placed on the legs of the patient O.

The positions of both local coils 1, 1' (located on the knees of the patient O) within the local coil array $A_1$ is now to be determined as follows. This initially involves determining the position $z_1$ in the z-direction relative to the position $z_L$ of the head-end of the patient table 2, i.e. relative to the origin of the patient table coordinate system. It is clear that the selection of this origin at the head-end of the patient table is arbitrary and that, in principle, the position can also be determined in any other patient table coordinate system, for example with an origin at the foot-end or in the middle of the patient table 2.

Since both the coordinates of the patient table 2 and the coordinates of the scanner 3 are known at every position of the patient table 2 relative to the scanner 3, the relative position $z_1$ of the coils 1, 1' on the patient table can also be determined without any further information, for a position of the local coils 1, 1' relative to a fixed point of the scanner 3, for example relative to the position $z_C$ of the center of the scanner 3. This is readily apparent from FIG. 1. The position $z_L$ of the head-end of the patient table 2 relative to the center of the scanner 3, i.e. thee distance $d_{CL}$, is known. The position $z_s$ of the local coil 1 relative to the head-end of the patient table 2, i.e. the distance $d_{L1}$ of the local coil relative to the head-end, is determined with the inventive method. The distance $d_{C1}$ between the local coil 1 and the center of the scanner 3, which ultimately corresponds to the position of the local coil 1 relative to the center of the scanner 3, automatically results from the difference $(d_{L1} - d_{CL})$ of the distances $d_{L1}, d_{CL}$.

FIG. 3A shows a signal profile $SP_1$ (acquired by the local coil 1) for both local coils 1, 1' located over the knees of the patient in FIG. 2. The signal intensity $I_S$ is plotted over the z-position relative to the center of the scanner 3. For the measurement (acquisition) of this signal profile $SP_1$, the patient table 2 was located in a position in which the coil 1 has located in approximately the middle (i.e. the center) of the scanner 3. The "dented" shape of the signal profile $SP_1$ results from the fact that the local coil 1 lies on the patient O and thus is located over an anatomical region representing a varying load.

FIGS. 3B through 3F show further signal profiles $SP_2$, $SP_3$, $SP_4$, $SP_5$, $SP_6$ plotted with the same local coil 1 in other positions of the patient table 2 relative to the scanner 3. The patient table 2 was successively shifted out from the scanner 3 in 10 cm steps, together with the patient O and the local coil 1. The coil profiles $SP_1$, $SP_2$, $SP_3$, $SP_4$, $SP_5$, $SP_6$, plotted relative to the magnetic field gradient (and consequently relative to the magnet and thus to the scanner 3), correspondingly shift.

As shown in FIGS. 3B through 3F the profiles $SP_1$, $SP_2$, $SP_3$, $SP_4$, $SP_5$, $SP_6$ vary more strongly the more the local coil 1 is moved to the edge of the scanner 3 or is moved out of the scanner 3. It can be already seen from FIG. 3F that an intelligible (meaningful) signal profile can no longer be measured when the local coil 1 is located outside the scanner 3. However, it is exceedingly difficult to define a limit up to which the plotted profile is still acceptable (i.e. supplies sensible spatial information) and at which that ceases to be the case. This also elucidates the problem of the previously-used method for position determination, in which only one of the signal profiles is present, and wherein a decision using this single profile is made as to whether the signal profile still contains correct spatial information or whether it cannot be used for spatial determination.

In the inventive plotting of a number of signal profiles along the z-axis, this decision can be made, for example, by an observation of the profile variation dependent on the spatial position as this can be better understood and recognized in the context of the entire acquisition series in FIGS. 3A through 3F.

It is clear that a complete evaluation of the entirety of the signal profiles $SP_1$, $SP_2$, $SP_3$, $SP_4$, $SP_5$, $SP_6$ is relatively burdensome. In order to accelerate the method, a characteristic position value (here the primary focus $M_1$, $M_2$, $M_3$, $M_4$, $M_5$, $M_6$ of the appertaining signal profile $SP_1$, $SP_2$, $SP_3$, $SP_4$, $SP_5$, $SP_6$) is respectively determined from the measured signal profile $SP_1$, $SP_2$, $SP_3$, $SP_4$, $SP_5$, $SP_6$. The automatic determination of the position of the local coil 1 then ensues based on the primary foci $M_1$, $M_2$, $M_3$, $M_4$, $M_5$, $M_6$ of the individual signal profiles $SP_1$, $SP_2$, $SP_3$, $SP_4$, $SP_5$, $SP_6$. A completely automatic determination of the primary foci $M_1$, $M_2$, $M_3$, $M_4$, $M_5$, $M_6$ can ensue in the control device 6 shown in FIG. 1, with the aid of a profile analysis unit 14 of the evaluation device 13.

These primary foci $M_1$, $M_2$, $M_3$, $M_4$, $M_5$, $M_6$ are subsequently transferred to a position calculation unit 15 that determines the correct position $z_1$ of the local coil 1 using the primary foci $M_1$, $M_2$, $M_3$, $M_4$, $M_5$, $M_6$.

The method preferably used is graphically represented in FIG. 4. FIG. 4 shows two function graphs $F_1$, $F_{1'}$ that have been determined respectively from the primary foci of the various profile measurements. For this purpose, the z-positions relative to the scanner center of the primary foci have respectively been plotted with respect to the position of the patient table 2 relative to the scanner 3 in the measurement of the respective associated signal profile. Two function graphs are plotted in FIG. 4 that have been determined for both coils 1, 1' characterized in FIG. 2, which coils 1, 1' exhibit the same position $z$, in the z-direction but lie to the left and right next to one another.

The patient table 2 was moved in the direction of the head during the measurement. The patient table position at which it was measured is plotted at the abscissa of the graph, i.e. here the position $z_L$ of the head end of the patient table 2 relative to the center of the scanner 3. In this example, the position value $z_L$ is plotted relative to the first measurement of this procedure. A value range from 0 to nearly 800 mm results from this. If the patient table 2 were moved over its entire length, a measurement of approximately 2000 mm would result. Since the position of the patient table 2, however, is known without any further information at each measurement, the relative positions can be converted without any further information.

Measurements were respectively made in very short steps of 10 to 20 mm in this experiment. Corresponding thereto, the position $z_M$ (in mm) of the primary focus of the determined signal profile relative to the center of the magnetic resonance scanner 3. A value of 0 mm corresponds to a position $z_M$ of the primary focus of the local coils 1, 1' or of the signal profile acquired by the local coils 1, 1', exactly in the middle of the scanner 3.

The primary foci $M_1$ through $M_6$ (determined in FIGS. 3A through 3F) of the signal profiles $SP_1$, $SP_2$, $SP_3$, $SP_4$, $SP_5$, $SP_6$ determined with the local coil 1 are likewise incidentally plotted in this graph 4 as components of the function graph $F_1$.

Both of the local coils 1, 1' within the scanner 3 are located in the region in which the function graphs $F_1$, $F_{1'}$ exhibit a constant slope—which here, due to the same units of the ordinate and abscissa, should lie approximately at −1—and the position of the local coils 1, 1' can be reliably concluded. The ranges of the function graphs $F_1$, $F_{1'}$ in which (in contrast) the slope significantly deviates from −1 are precisely the problem regions in which false positions would be determined given a purely stationary coil position detection according to the known method, and which significantly complicates the reliability of the conventional method.

The determination of the precise coil position preferably occurs by adopting a straight line G that exhibits the slope −1 to the function graphs $F_1$, $F_{1'}$. This adaptation of a straight line G can ensue, for example, by minimizing the deviation of the function values of the function graphs $F_1$, $F_{1'}$ from the appertaining straight line G. When the straight line G is correctly adapted to the function graphs $F_1$, $F_{1'}$, the coil position can be directly read with the aid of this straight line G. The ordinate value 0 mm in the graph here corresponds exactly to the table position head=340 mm. This means that the coils 1, 1' were located exactly in the middle of the scanner 3 as the patient table 2 was shifted by 340 mm relative to the first implemented measurement. Since all positions of the patient table 2 are plotted relative to the coordinate system of the scanner 3, this position can be converted directly into the z-coordinate $z_1$ of the sought coils 1, 1' in the coordinate system of the recumbent board 2.

Measurement errors due to noise are also automatically eliminated via the adaptation of the straight line G to the function graphs $F_1$, $F_{1'}$. Furthermore; measurement errors due to a distortion, which in particular concerns the ranges on the x-axis from 80 to 160 mm and 500 to 580 mm, are eliminated since these are point-symmetric in the graph without anything further and thus are averaged away.

As soon as the z-position $z_1$ of the coils 1, 1' is known exactly, the system can automatically move the patient table 2 into a position in which the local coils 1, 1' to be localized are disposed with certainty within the scanner 3, for example in the center of the scanner 3. Further coil profiles in the x-direction and y-direction then can be subsequently acquired during the application of the x- and y-magnetic field gradient, and plotted, and thus the local coils 1, 1' can be fully automatically localized in all three spatial directions.

The positions of the other local coils shown in FIG. 2 can be exactly determined in the same manner. It is possible to simultaneously acquire, the respective signal profiles for a large number of coils for determination of the position of each of the appertaining local coils. This means that it is not necessary to move the patient table 2 through the scanner multiple times in order to correctly determine the z-positions of all of the individual local coils.

The components necessary for implementation of the invention in a magnetic resonance system, such as the activation unit 11, the measurement device 12 and the evaluation device 13 with the profile analysis unit 14 and the position calculation unit 15, can be realized completely or in a predominant part in the form of software modules. Typical magnetic resonance systems have programmable control devices anyway, and the invention preferably is realized in this manner with the aid of suitable control software. This means that a corresponding computer program product is loaded directly into the memory of a programmable control device of the appertaining magnetic resonance examination system, the computer program product embodying program code to implement the inventive method.

The method steps described in detail in the preceding as well as the illustrated magnetic resonance system are only exemplary embodiments which can be modified by those skilled in the art without departing from the scope of the invention. For example, the signal profiles acquired in the movement of the patient table 2 through the scanner can be compared in their entirety and particularly good signal profiles (or, in the extreme case, only one particularly good signal profile) can be chosen by the comparison, and the position of the local coil could then be determined based thereon.

Although the invention was described above in the example of magnetic resonance systems in the medical field, usage of the invention is not limited to this field; rather, he invention can likewise be used in scientific and/or industrial systems.

I claim as my invention:

1. A method for automatically determining a position, in a spatial direction, of a local coil on a patient table in a magnetic resonance scanner, comprising the step of:
    emitting a radio frequency signal into a volume in a magnetic resonance scanner in which a local coil i disposed on a movable patient table, while applying a magnetic gradient field along a spatial direction in said volume;
    moving said patient table through a plurality of positions relative to said scanner and, at each of said positions, acquiring a signal profile with said local coil resulting from said radio frequency signal, thereby acquiring a plurality of signal profiles; and
    determining a position of said local coil from said plurality of signal profiles.

2. A method as claimed in claim 1 comprising, in each signal profile in said plurality of signal profiles, designating a characteristic position value, and determining said position of said local coil based on the respective characteristic position values of said plurality of signal profiles.

3. A method claimed in claim 2 comprising fitting a straight line, with a predetermined slops, to the respective characteristic position value as a function of the respective positions of said patient table at which the respective signal profiles were acquired, and determining said position of said local coil using said straight line.

4. A method as claimed in claim in comprising acquiring measurement values during acquisition of said plurality of signal profiles at positions of said patient table selected from the group consisting of positions of the patient table at which the respective signal profiles were acquired, and positions of the patient table between the positions at which the respective signal profiles were acquired, and determining system parameters from said measurement values and additionally using said system parameters for determining said position of said local coil.

5. A control device for automatically determining a position, in a spatial direction, of a local coil on a moveable patient table in a magnetic resonance scanner, comprising:
    an activation unit for causing the magnetic resonance scanner to emit a radio frequency signal into a volume in a magnetic resonance scanner in which the local coil is disposed on the moveable patient table, while applying a magnetic gradient field along a spatial direction in said volume, and for moving said patient table through a plurality of positions relative to said scanner;
    a measurement unit for, at each of said positions, acquiring a signal profile with said local coil resulting from said radio frequency signal, thereby acquiring a plurality of signal profiles; and an evaluation unit for determining a position of said local coil from said plurality of signal profiles.

6. A control device as claimed in claim 5 wherein said evaluation unit comprises a profile analysis unit for designating, in each signal profile in said plurality of signal profiles, a characteristic position value, and a position calculation unit for determining said position of said local coil based on the respective characteristic position values of said plurality of signal profiles.

7. A control device as claimed in claim 6 wherein said position calculation unit fits a straight line, with a predetermined slope, to the respective characteristic position value as a function of the respective positions of said patient table at which the respective signal profiles were acquired, and determines said position of said local coil using said straight line.

8. A magnetic resonance tomography apparatus comprising:
    a magnetic resonance scanner;
    a local coil disposed in said magnetic resonance scanner;
    a movable patient table disposed in said scanner;
    a gradient field generator that generates a magnetic field gradient field in a volume in said scanner in which said local coil is disposed; and
    a control device comprising an activation unit for causing the magnetic resonance scanner to emit a radio frequency signal into a volume in a magnetic resonance scanner in which the local coil is disposed on the moveable patient table, while applying said magnetic gradient field along a spatial direction in said volume, and for moving said patient table through a plurality of positions relative to said scanner, a measurement unit for, at each of said positions, acquiring a signal profile with said local coil resulting from said radio frequency signal, thereby acquiring a plurality of signal profiles, and an evaluation unit for determining a position of said local coil from said plurality of signal profiles.

9. A computer program product stored as readable program code on a storage medium, said storage medium being loadable into a control device of a magnetic resonance tomography apparatus having a magnetic resonance scanner with a local coil, a gradient field generator, and a movable patient table therein, said control device comprising an activation unit, a measurement unit and an evaluation unit, and said computer program product, when loaded into said control device, causing said control device to:

operate said local coil to emit a radio frequency signal into a volume in the magnetic resonance scanner in which the local coil is disposed on the moveable patient table, while operating said gradient field generator to apply a magnetic gradient field along a spatial direction in said volume;

operate said activation unit to move said patient table through a plurality of positions relative to said scanner and to operate said measurement unit to acquire, at each of said positions, a signal profile with said local coil resulting from said radio frequency signal, thereby acquiring a plurality of signal profiles; and operate said evaluation unit to determine a position of said local coil from said plurality of signal profiles.

\* \* \* \* \*